US008253452B2

(12) United States Patent
Kushnarenko

(10) Patent No.: US 8,253,452 B2
(45) Date of Patent: Aug. 28, 2012

(54) CIRCUIT AND METHOD FOR POWERING UP AN INTEGRATED CIRCUIT AND AN INTEGRATED CIRCUIT UTILIZING SAME

(75) Inventor: Alexander Kushnarenko, Haifa (IL)

(73) Assignee: Spansion Israel Ltd, Netanya (IL)

( * ) Notice: Subject to any disclaimer, the term of this patent is extended or adjusted under 35 U.S.C. 154(b) by 1363 days.

(21) Appl. No.: 11/357,081

(22) Filed: Feb. 21, 2006

(65) Prior Publication Data

US 2007/0194835 A1 Aug. 23, 2007

(51) Int. Cl.
*H03L 7/00* (2006.01)

(52) U.S. Cl. ........................................ 327/143; 327/539

(58) Field of Classification Search .................. 327/143, 327/198, 539

See application file for complete search history.

(56) References Cited

U.S. PATENT DOCUMENTS

| | | | |
|---|---|---|---|
| 3,881,180 | A | 4/1975 | Gosney, Jr. |
| 3,895,360 | A | 7/1975 | Cricchi et al. |
| 3,952,325 | A | 4/1976 | Beale et al. |
| 4,016,588 | A | 4/1977 | Ohya et al. |
| 4,017,888 | A | 4/1977 | Christie et al. |
| 4,145,703 | A | 3/1979 | Blanchard et al. |
| 4,151,021 | A | 4/1979 | McElroy |
| 4,173,766 | A | 11/1979 | Hayes |
| 4,173,791 | A | 11/1979 | Bell |
| 4,247,861 | A | 1/1981 | Hsu et al. |
| 4,257,832 | A | 3/1981 | Schwabe et al. |
| 4,281,397 | A | 7/1981 | Neal et al. |
| 4,306,353 | A | 12/1981 | Jacobs et al. |
| 4,342,102 | A | 7/1982 | Puar |
| 4,342,149 | A | 8/1982 | Jacobs et al. |
| 4,360,900 | A | 11/1982 | Bate |
| 4,373,248 | A | 2/1983 | McElroy |
| 4,380,057 | A | 4/1983 | Kotecha et al. |
| 4,388,705 | A | 6/1983 | Sheppard |
| 4,389,705 | A | 6/1983 | Sheppard |
| 4,404,747 | A | 9/1983 | Collins |

(Continued)

FOREIGN PATENT DOCUMENTS

EP 0 656 628 6/1995

(Continued)

OTHER PUBLICATIONS

U.S. Appl. No. 08/902,890, filed Jul. 30, 1997, Eitan.

(Continued)

*Primary Examiner* — Quan Tra
(74) *Attorney, Agent, or Firm* — Eitan Mehulal & Sadot

(57) ABSTRACT

The present invention is a circuit and method for providing a reference voltage and/or one or more circuit/circuit-block enabling signals for an IC. As the voltage level on a power supply line ramps upward towards or above a nominal operating voltage, a first threshold voltage detector circuit segment may be activated and may begin to generate a bandgap reset signal once the voltage level of the power supply reaches a first threshold voltage level. The bandgap reset signal may trigger the power-up and operation of a bandgap reference circuit segment, and according to further embodiments of the present invention, a second threshold voltage detector circuit segment, which second threshold voltage detector circuit segment may be matched with the first voltage detector circuit, may generate a voltage reset signal indicating that the bandgap reference source is powering-up. Once the supply voltage reaches a third threshold reference voltage, the first detector may disable the bandgap reset.

18 Claims, 6 Drawing Sheets

U.S. PATENT DOCUMENTS
4,435,786 A 3/1984 Tickle
4,446,381 A * 5/1984 Dalrymple .................... 327/143
4,448,400 A 5/1984 Harari
4,471,373 A 9/1984 Shimizu et al.
4,494,016 A 1/1985 Ransom et al.
4,507,673 A 3/1985 Aoyama
4,521,796 A 6/1985 Rajkanan et al.
4,527,257 A 7/1985 Cricchi
4,586,163 A 4/1986 Koike
4,613,956 A 9/1986 Paterson et al.
4,630,085 A 12/1986 Koyama
4,663,645 A 5/1987 Komori et al.
4,665,426 A 5/1987 Allen et al.
4,667,217 A 5/1987 Janning
4,672,409 A 6/1987 Takei et al.
4,725,984 A 2/1988 Ip et al.
4,733,105 A 3/1988 Shin et al.
4,742,491 A 5/1988 Liang et al.
4,758,869 A 7/1988 Eitan et al.
4,760,555 A 7/1988 Gelsomini et al.
4,761,764 A 8/1988 Watanabe
4,769,340 A 9/1988 Chang et al.
4,780,424 A 10/1988 Holler et al.
4,839,705 A 6/1989 Tigelaar et al.
4,847,808 A 7/1989 Kobatake
4,857,770 A 8/1989 Partovi et al.
4,870,470 A 9/1989 Bass, Jr. et al.
4,888,735 A 12/1989 Lee et al.
4,916,671 A 4/1990 Ichiguchi
4,941,028 A 7/1990 Chen et al.
4,961,010 A 10/1990 Davis
4,992,391 A 2/1991 Wang
5,021,999 A 6/1991 Kohda et al.
5,027,321 A 6/1991 Park
5,029,063 A 7/1991 Lingstaedt et al.
5,042,009 A 8/1991 Kazerounian et al.
5,075,245 A 12/1991 Woo et al.
5,081,371 A 1/1992 Wong
5,086,325 A 2/1992 Schumann et al.
5,094,968 A 3/1992 Schumann et al.
5,104,819 A 4/1992 Freiberger et al.
5,117,389 A 5/1992 Yiu
5,120,672 A 6/1992 Mitchell et al.
5,142,495 A 8/1992 Canepa
5,142,496 A 8/1992 Van Buskirk
5,159,570 A 10/1992 Mitchell et al.
5,168,334 A 12/1992 Mitchell et al.
5,172,338 A 12/1992 Mehrotra et al.
5,175,120 A 12/1992 Lee
5,204,835 A 4/1993 Eitan
5,214,303 A 5/1993 Aoki
5,237,213 A 8/1993 Tanoi
5,241,497 A 8/1993 Komarek
5,260,593 A 11/1993 Lee
5,268,861 A 12/1993 Hotta
5,276,646 A 1/1994 Kim et al.
5,280,420 A 1/1994 Rapp
5,289,412 A 2/1994 Frary et al.
5,293,563 A 3/1994 Ohta
5,295,092 A 3/1994 Hotta et al.
5,295,108 A 3/1994 Higa
5,305,262 A 4/1994 Yoneda
5,311,049 A 5/1994 Tsuruta
5,315,541 A 5/1994 Harari et al.
5,324,675 A 6/1994 Hayabuchi
5,334,555 A 8/1994 Sugiyama et al.
5,335,198 A 8/1994 Van Buskirk et al.
5,338,954 A 8/1994 Shimoji
5,345,425 A 9/1994 Shikatani
5,349,221 A 9/1994 Shimoji
5,350,710 A 9/1994 Hong et al.
5,352,620 A 10/1994 Komori et al.
5,357,134 A 10/1994 Shimoji
5,359,554 A 10/1994 Odake et al.
5,361,343 A 11/1994 Kosonocky et al.
5,366,915 A 11/1994 Kodama
5,375,094 A 12/1994 Naruke
5,381,374 A 1/1995 Shiraishi et al.
5,393,701 A 2/1995 Ko et al.
5,394,355 A 2/1995 Uramoto et al.
5,399,891 A 3/1995 Yiu et al.
5,400,286 A 3/1995 Chu et al.
5,402,374 A 3/1995 Tsuruta et al.
5,412,601 A 5/1995 Sawada et al.
5,414,693 A 5/1995 Ma et al.
5,418,176 A 5/1995 Yang et al.
5,418,743 A 5/1995 Tomioka et al.
5,422,844 A 6/1995 Wolstenholme et al.
5,424,567 A 6/1995 Chen
5,424,978 A 6/1995 Wada et al.
5,426,605 A 6/1995 Van Berkel et al.
5,434,825 A 7/1995 Harari et al.
5,436,478 A 7/1995 Bergemont et al.
5,436,481 A 7/1995 Egawa et al.
5,440,505 A 8/1995 Fazio et al.
5,450,341 A 9/1995 Sawada et al.
5,450,354 A 9/1995 Sawada et al.
5,455,793 A 10/1995 Amin et al.
5,467,308 A 11/1995 Chang et al.
5,477,499 A 12/1995 Van Buskirk et al.
5,495,440 A 2/1996 Asakura
5,496,753 A 3/1996 Sakurai et al.
5,508,968 A 4/1996 Collins et al.
5,518,942 A 5/1996 Shrivastava
5,521,870 A 5/1996 Ishikawa
5,523,251 A 6/1996 Hong
5,523,972 A 6/1996 Rashid et al.
5,530,803 A 6/1996 Chang et al.
5,534,804 A 7/1996 Woo
5,537,358 A 7/1996 Fong
5,544,116 A 8/1996 Chao et al.
5,553,018 A 9/1996 Wang et al.
5,553,030 A 9/1996 Tedrow et al.
5,557,221 A 9/1996 Taguchi et al.
5,557,570 A 9/1996 Iwahashi
5,559,687 A 9/1996 Nicollini et al.
5,563,823 A 10/1996 Yiu et al.
5,568,085 A 10/1996 Eitan et al.
5,579,199 A 11/1996 Kawamura et al.
5,581,252 A 12/1996 Thomas
5,583,808 A 12/1996 Brahmbhatt
5,590,068 A 12/1996 Bergemont
5,590,074 A 12/1996 Akaogi et al.
5,592,417 A 1/1997 Mirabel
5,596,527 A 1/1997 Tomioka et al.
5,599,727 A 2/1997 Hakozaki et al.
5,600,586 A 2/1997 Lee
5,606,523 A 2/1997 Mirabel
5,608,679 A 3/1997 Mi et al.
5,612,642 A 3/1997 McClinyock
5,617,357 A 4/1997 Haddad et al.
5,623,438 A 4/1997 Guritz et al.
5,627,790 A 5/1997 Golla et al.
5,633,603 A 5/1997 Lee
5,636,288 A 6/1997 Bonneville et al.
5,644,531 A 7/1997 Kuo et al.
5,654,568 A 8/1997 Nakao
5,656,513 A 8/1997 Wang et al.
5,657,332 A 8/1997 Auclair et al.
5,661,060 A 8/1997 Gill et al.
5,663,907 A 9/1997 Frayer et al.
5,672,959 A 9/1997 Der
5,675,280 A 10/1997 Nomura
5,677,867 A 10/1997 Hazani
5,677,869 A 10/1997 Fazio et al.
5,683,925 A 11/1997 Irani et al.
5,689,459 A 11/1997 Chang et al.
5,694,356 A 12/1997 Wong et al.
5,696,929 A 12/1997 Hasbun et al.
5,708,608 A 1/1998 Park et al.
5,712,814 A 1/1998 Fratin et al.
5,712,815 A 1/1998 Bill et al.
5,715,193 A 2/1998 Norman
5,717,581 A 2/1998 Canclini
5,717,632 A 2/1998 Richart et al.
5,717,635 A 2/1998 Akatsu
5,726,946 A 3/1998 Yamagata et al.

| | | | |
|---|---|---|---|
| 5,748,534 | A | 5/1998 | Dunlap et al. |
| 5,751,037 | A | 5/1998 | Aozasa et al. |
| 5,751,637 | A | 5/1998 | Chen et al. |
| 5,754,475 | A | 5/1998 | Bill et al. |
| 5,760,445 | A | 6/1998 | Diaz |
| 5,760,634 | A | 6/1998 | Fu |
| 5,768,192 | A | 6/1998 | Eitan |
| 5,768,193 | A | 6/1998 | Lee et al. |
| 5,771,197 | A | 6/1998 | Kim |
| 5,774,395 | A | 6/1998 | Richart et al. |
| 5,777,919 | A | 7/1998 | Chi-Yung et al. |
| 5,781,476 | A | 7/1998 | Seki et al. |
| 5,781,478 | A | 7/1998 | Takeuchi et al. |
| 5,783,934 | A | 7/1998 | Tran |
| 5,784,314 | A | 7/1998 | Sali et al. |
| 5,787,036 | A | 7/1998 | Okazawa |
| 5,793,079 | A | 8/1998 | Georgescu et al. |
| 5,801,076 | A | 9/1998 | Ghneim et al. |
| 5,805,500 | A | 9/1998 | Campardo et al. |
| 5,808,506 | A | 9/1998 | Tran |
| 5,812,449 | A | 9/1998 | Song |
| 5,812,456 | A | 9/1998 | Hull et al. |
| 5,812,457 | A | 9/1998 | Arase |
| 5,815,435 | A | 9/1998 | Van Tran |
| 5,822,256 | A | 10/1998 | Bauer et al. |
| 5,825,683 | A | 10/1998 | Chang |
| 5,825,686 | A | 10/1998 | Schmitt-Landsiedel et al. |
| 5,828,601 | A | 10/1998 | Hollmer et al. |
| 5,834,851 | A | 11/1998 | Ikeda et al. |
| 5,835,935 | A | 11/1998 | Estakhri et al. |
| 5,836,772 | A | 11/1998 | Chang et al. |
| 5,841,700 | A | 11/1998 | Chang |
| 5,847,441 | A | 12/1998 | Cutter et al. |
| 5,861,771 | A | 1/1999 | Matsuda et al. |
| 5,862,076 | A | 1/1999 | Eitan |
| 5,864,164 | A | 1/1999 | Wen |
| 5,867,429 | A | 2/1999 | Chen et al. |
| 5,870,334 | A | 2/1999 | Hemink et al. |
| 5,870,335 | A | 2/1999 | Khan et al. |
| 5,875,128 | A | 2/1999 | Ishizuka et al. |
| 5,877,537 | A | 3/1999 | Aoki |
| 5,880,620 | A | 3/1999 | Gitlin et al. |
| 5,886,927 | A | 3/1999 | Takeuchi |
| RE36,179 | E | 4/1999 | Shimoda |
| 5,892,710 | A | 4/1999 | Fazio et al. |
| 5,903,031 | A | 5/1999 | Yamada et al. |
| 5,910,924 | A | 6/1999 | Tanaka et al. |
| 5,920,503 | A | 7/1999 | Lee et al. |
| 5,920,507 | A | 7/1999 | Takeuchi et al. |
| 5,926,409 | A | 7/1999 | Engh et al. |
| 5,930,195 | A | 7/1999 | Komatsu et al. |
| 5,933,366 | A | 8/1999 | Yoshikawa |
| 5,933,367 | A | 8/1999 | Matsuo et al. |
| 5,936,888 | A | 8/1999 | Sugawara |
| 5,940,332 | A | 8/1999 | Artieri |
| 5,946,258 | A | 8/1999 | Evertt et al. |
| 5,946,558 | A | 8/1999 | Hsu |
| 5,949,714 | A | 9/1999 | Hemink et al. |
| 5,949,728 | A | 9/1999 | Liu et al. |
| 5,963,412 | A | 10/1999 | En |
| 5,963,465 | A | 10/1999 | Eitan |
| 5,966,603 | A | 10/1999 | Eitan |
| 5,969,989 | A | 10/1999 | Iwahashi |
| 5,969,993 | A | 10/1999 | Takeshima |
| 5,973,373 | A | 10/1999 | Krautschneider et al. |
| 5,982,666 | A | 11/1999 | Campardo |
| 5,986,940 | A | 11/1999 | Atsumi et al. |
| 5,990,526 | A | 11/1999 | Bez et al. |
| 5,991,202 | A | 11/1999 | Derhacobian et al. |
| 5,999,444 | A | 12/1999 | Fujiwara et al. |
| 5,999,494 | A | 12/1999 | Holzrichter |
| 6,000,006 | A | 12/1999 | Bruce et al. |
| 6,005,423 | A | 12/1999 | Schultz |
| 6,011,725 | A | 1/2000 | Eitan |
| 6,018,186 | A | 1/2000 | Hsu |
| 6,020,241 | A | 2/2000 | You et al. |
| 6,028,324 | A | 2/2000 | Su et al. |
| 6,030,871 | A | 2/2000 | Eitan |
| 6,034,403 | A | 3/2000 | Wu |
| 6,034,896 | A | 3/2000 | Ranaweera et al. |
| 6,037,627 | A | 3/2000 | Kitamura et al. |
| 6,040,610 | A | 3/2000 | Noguchi et al. |
| 6,044,019 | A | 3/2000 | Cernea et al. |
| 6,044,022 | A | 3/2000 | Nachumovsky |
| 6,063,666 | A | 5/2000 | Chang et al. |
| 6,064,226 | A | 5/2000 | Earl |
| 6,064,251 | A | 5/2000 | Park |
| 6,064,591 | A | 5/2000 | Takeuchi et al. |
| 6,074,916 | A | 6/2000 | Cappelletti |
| 6,075,402 | A | 6/2000 | Ghilardelli |
| 6,075,724 | A | 6/2000 | Li et al. |
| 6,078,518 | A | 6/2000 | Chevallier |
| 6,081,456 | A | 6/2000 | Dadashev |
| 6,084,794 | A | 7/2000 | Lu et al. |
| 6,091,640 | A | 7/2000 | Kawahara et al. |
| 6,094,095 | A | 7/2000 | Murray et al. |
| 6,097,639 | A | 8/2000 | Choi et al. |
| 6,107,862 | A | 8/2000 | Mukainakano et al. |
| 6,108,240 | A | 8/2000 | Lavi et al. |
| 6,108,241 | A | 8/2000 | Chevallier |
| 6,117,714 | A | 9/2000 | Beatty |
| 6,118,207 | A | 9/2000 | Ormerod et al. |
| 6,118,692 | A | 9/2000 | Banks |
| 6,122,198 | A | 9/2000 | Haddad et al. |
| 6,128,226 | A | 10/2000 | Eitan et al. |
| 6,128,227 | A | 10/2000 | Kim |
| 6,130,572 | A | 10/2000 | Ghilardelli et al. |
| 6,130,574 | A | 10/2000 | Bloch et al. |
| 6,133,095 | A | 10/2000 | Eitan et al. |
| 6,134,156 | A | 10/2000 | Eitan |
| 6,137,718 | A | 10/2000 | Reisinger |
| 6,147,904 | A | 11/2000 | Liron |
| 6,150,800 | A | 11/2000 | Kinoshita et al. |
| 6,154,081 | A | 11/2000 | Pakkala et al. |
| 6,156,149 | A | 12/2000 | Cheung et al. |
| 6,157,242 | A | 12/2000 | Fukui |
| 6,157,570 | A | 12/2000 | Nachumovsky |
| 6,163,048 | A | 12/2000 | Hirose et al. |
| 6,163,484 | A | 12/2000 | Uekubo |
| 6,169,691 | B1 | 1/2001 | Pasotti et al. |
| 6,175,523 | B1 | 1/2001 | Yang et al. |
| 6,181,597 | B1 | 1/2001 | Nachumovsky |
| 6,181,605 | B1 | 1/2001 | Hollmer et al. |
| 6,185,143 | B1 | 2/2001 | Perner et al. |
| 6,188,211 | B1 | 2/2001 | Rincon-Mora et al. |
| 6,190,966 | B1 | 2/2001 | Ngo et al. |
| 6,192,445 | B1 | 2/2001 | Rezvani |
| 6,195,196 | B1 | 2/2001 | Kimura et al. |
| 6,198,342 | B1 | 3/2001 | Kawai |
| 6,201,282 | B1 | 3/2001 | Eitan |
| 6,201,737 | B1 | 3/2001 | Hollmer et al. |
| 6,204,708 | B1 * | 3/2001 | Alexander .................... 327/203 |
| 6,205,056 | B1 | 3/2001 | Pan et al. |
| 6,205,059 | B1 | 3/2001 | Gutala et al. |
| 6,208,200 | B1 | 3/2001 | Arakawa |
| 6,208,557 | B1 | 3/2001 | Bergemont et al. |
| 6,214,666 | B1 | 4/2001 | Mehta |
| 6,215,148 | B1 | 4/2001 | Eitan |
| 6,215,697 | B1 | 4/2001 | Lu et al. |
| 6,215,702 | B1 | 4/2001 | Derhacobian et al. |
| 6,218,695 | B1 | 4/2001 | Nachumovsky |
| 6,219,277 | B1 | 4/2001 | Devin et al. |
| 6,219,290 | B1 | 4/2001 | Chang et al. |
| 6,222,762 | B1 | 4/2001 | Guterman et al. |
| 6,222,768 | B1 | 4/2001 | Hollmer et al. |
| 6,233,180 | B1 | 5/2001 | Eitan et al. |
| 6,240,032 | B1 | 5/2001 | Fukumoto |
| 6,240,040 | B1 | 5/2001 | Akaogi et al. |
| 6,246,555 | B1 | 6/2001 | Tham |
| 6,252,442 | B1 | 6/2001 | Malherbe |
| 6,252,799 | B1 | 6/2001 | Liu et al. |
| 6,256,231 | B1 | 7/2001 | Lavi et al. |
| 6,261,904 | B1 | 7/2001 | Pham et al. |
| 6,265,268 | B1 | 7/2001 | Halliyal et al. |
| 6,266,281 | B1 | 7/2001 | Derhacobian et al. |
| 6,272,047 | B1 | 8/2001 | Mihnea et al. |
| 6,275,414 | B1 | 8/2001 | Randolph et al. |
| 6,281,545 | B1 | 8/2001 | Liang et al. |

| | | | | |
|---|---|---|---|---|
| 6,282,133 | B1 | 8/2001 | Nakagawa et al. | |
| 6,282,145 | B1 | 8/2001 | Tran et al. | |
| 6,285,246 | B1 | 9/2001 | Basu | |
| 6,285,574 | B1 | 9/2001 | Eitan | |
| 6,285,589 | B1 | 9/2001 | Kajitani | |
| 6,285,614 | B1 | 9/2001 | Mulatti et al. | |
| 6,292,394 | B1 | 9/2001 | Cohen et al. | |
| 6,297,096 | B1 | 10/2001 | Boaz | |
| 6,297,143 | B1 | 10/2001 | Foote et al. | |
| 6,297,974 | B1 | 10/2001 | Ganesan et al. | |
| 6,304,485 | B1 | 10/2001 | Harari et al. | |
| 6,307,784 | B1 | 10/2001 | Hamilton et al. | |
| 6,307,807 | B1 | 10/2001 | Sakui et al. | |
| 6,320,428 | B1 * | 11/2001 | Atsumi et al. | 327/143 |
| 6,320,786 | B1 | 11/2001 | Chang et al. | |
| 6,324,094 | B1 | 11/2001 | Chevallier | |
| 6,326,265 | B1 | 12/2001 | Liu et al. | |
| 6,330,192 | B1 | 12/2001 | Ohba et al. | |
| 6,331,950 | B1 | 12/2001 | Kuo et al. | |
| 6,335,874 | B1 | 1/2002 | Eitan | |
| 6,337,502 | B1 | 1/2002 | Eitan et al. | |
| 6,339,556 | B1 | 1/2002 | Watanabe | |
| 6,343,033 | B1 | 1/2002 | Parker | |
| 6,346,442 | B1 | 2/2002 | Aloni et al. | |
| 6,348,381 | B1 | 2/2002 | Jong | |
| 6,348,711 | B1 | 2/2002 | Eitan | |
| 6,351,415 | B1 | 2/2002 | Kushnarenko | |
| 6,353,356 | B1 | 3/2002 | Liu | |
| 6,353,554 | B1 | 3/2002 | Banks | |
| 6,353,555 | B1 | 3/2002 | Jeong | |
| 6,356,469 | B1 | 3/2002 | Roohparvar et al. | |
| 6,359,501 | B2 | 3/2002 | Lin et al. | |
| 6,374,337 | B1 | 4/2002 | Estakhri | |
| 6,385,086 | B1 | 5/2002 | Mihara et al. | |
| 6,396,741 | B1 | 5/2002 | Bloom et al. | |
| 6,400,209 | B1 | 6/2002 | Matsuyama et al. | |
| 6,400,607 | B1 | 6/2002 | Pasotti et al. | |
| 6,407,537 | B2 | 6/2002 | Antheunis | |
| 6,410,388 | B1 | 6/2002 | Kluth et al. | |
| 6,417,081 | B1 | 7/2002 | Thurgate | |
| 6,418,506 | B1 | 7/2002 | Pashley et al. | |
| 6,426,898 | B1 | 7/2002 | Mihnea et al. | |
| 6,429,063 | B1 | 8/2002 | Eitan | |
| 6,433,624 | B1 | 8/2002 | Grossnickle et al. | |
| 6,436,766 | B1 | 8/2002 | Rangarajan et al. | |
| 6,436,768 | B1 | 8/2002 | Yang et al. | |
| 6,438,031 | B1 | 8/2002 | Fastow | |
| 6,438,035 | B2 | 8/2002 | Yamamoto et al. | |
| 6,440,797 | B1 | 8/2002 | Wu et al. | |
| 6,442,074 | B1 | 8/2002 | Hamilton et al. | |
| 6,445,030 | B1 | 9/2002 | Wu et al. | |
| 6,449,188 | B1 | 9/2002 | Fastow | |
| 6,449,190 | B1 | 9/2002 | Bill | |
| 6,452,438 | B1 | 9/2002 | Li | |
| 6,456,528 | B1 | 9/2002 | Chen | |
| 6,456,533 | B1 | 9/2002 | Hamilton et al. | |
| 6,458,656 | B1 | 10/2002 | Park et al. | |
| 6,458,677 | B1 | 10/2002 | Hopper et al. | |
| 6,469,929 | B1 | 10/2002 | Kushnarenko et al. | |
| 6,469,935 | B2 | 10/2002 | Hayashi | |
| 6,472,706 | B2 | 10/2002 | Widdershoven et al. | |
| 6,477,085 | B1 | 11/2002 | Kuo | |
| 6,490,204 | B2 | 12/2002 | Bloom et al. | |
| 6,496,414 | B2 | 12/2002 | Kasa et al. | |
| 6,504,756 | B2 | 1/2003 | Gonzalez et al. | |
| 6,510,082 | B1 | 1/2003 | Le et al. | |
| 6,512,701 | B1 | 1/2003 | Hamilton et al. | |
| 6,519,180 | B2 | 2/2003 | Tran et al. | |
| 6,519,182 | B1 | 2/2003 | Derhacobian et al. | |
| 6,522,585 | B2 | 2/2003 | Pasternak | |
| 6,525,969 | B1 | 2/2003 | Kurihara et al. | |
| 6,528,390 | B2 | 3/2003 | Komori et al. | |
| 6,529,412 | B1 | 3/2003 | Chen et al. | |
| 6,532,173 | B2 | 3/2003 | Lioka et al. | |
| 6,535,020 | B1 | 3/2003 | Yin | |
| 6,535,434 | B2 | 3/2003 | Maayan et al. | |
| 6,537,881 | B1 | 3/2003 | Rangarjan et al. | |
| 6,538,270 | B1 | 3/2003 | Randolph et al. | |
| 6,541,816 | B2 | 4/2003 | Ramsbey et al. | |
| 6,552,387 | B1 | 4/2003 | Eitan | |
| 6,555,436 | B2 | 4/2003 | Ramsbey et al. | |
| 6,559,500 | B2 | 5/2003 | Torii | |
| 6,562,683 | B1 | 5/2003 | Wang et al. | |
| 6,566,194 | B1 | 5/2003 | Ramsbey et al. | |
| 6,566,699 | B2 | 5/2003 | Eitan | |
| 6,567,303 | B1 | 5/2003 | Hamilton et al. | |
| 6,567,312 | B1 | 5/2003 | Torii et al. | |
| 6,574,139 | B2 | 6/2003 | Kurihara | |
| 6,577,514 | B2 | 6/2003 | Shor et al. | |
| 6,577,532 | B1 | 6/2003 | Chevallier | |
| 6,577,547 | B2 | 6/2003 | Ukon | |
| 6,583,005 | B2 | 6/2003 | Hashimoto et al. | |
| 6,583,479 | B1 | 6/2003 | Fastow et al. | |
| 6,584,017 | B2 | 6/2003 | Maayan et al. | |
| 6,590,811 | B1 | 7/2003 | Hamilton et al. | |
| 6,593,606 | B1 | 7/2003 | Randolph et al. | |
| 6,594,181 | B1 | 7/2003 | Yamada | |
| 6,608,526 | B1 | 8/2003 | Sauer | |
| 6,614,052 | B1 | 9/2003 | Zhang | |
| 6,614,295 | B2 | 9/2003 | Tsuchi | |
| 6,614,686 | B1 | 9/2003 | Kawamura | |
| 6,614,692 | B2 | 9/2003 | Maayan et al. | |
| 6,617,179 | B1 | 9/2003 | Kim | |
| 6,617,215 | B1 | 9/2003 | Halliyal et al. | |
| 6,618,290 | B1 | 9/2003 | Wang et al. | |
| 6,624,672 | B2 | 9/2003 | Confaloneri et al. | |
| 6,627,555 | B2 | 9/2003 | Eitan et al. | |
| 6,630,384 | B1 | 10/2003 | Sun et al. | |
| 6,633,496 | B2 | 10/2003 | Maayan et al. | |
| 6,633,499 | B1 | 10/2003 | Eitan et al. | |
| 6,633,956 | B1 | 10/2003 | Mitani | |
| 6,636,440 | B2 | 10/2003 | Maayan et al. | |
| 6,639,271 | B1 | 10/2003 | Zheng et al. | |
| 6,639,837 | B2 | 10/2003 | Takano et al. | |
| 6,639,844 | B1 | 10/2003 | Liu et al. | |
| 6,639,849 | B2 | 10/2003 | Takahashi et al. | |
| 6,642,148 | B1 | 11/2003 | Ghandehari et al. | |
| 6,642,573 | B1 | 11/2003 | Halliyal et al. | |
| 6,642,586 | B2 | 11/2003 | Takahashi | |
| 6,643,170 | B2 | 11/2003 | Huang et al. | |
| 6,643,177 | B1 | 11/2003 | Le et al. | |
| 6,643,178 | B2 | 11/2003 | Kurihara | |
| 6,643,181 | B2 | 11/2003 | Sofer et al. | |
| 6,645,801 | B1 | 11/2003 | Ramsbey et al. | |
| 6,649,972 | B2 | 11/2003 | Eitan | |
| 6,650,568 | B2 | 11/2003 | Iijima | |
| 6,653,190 | B1 | 11/2003 | Yang et al. | |
| 6,653,191 | B1 | 11/2003 | Yang et al. | |
| 6,654,296 | B2 | 11/2003 | Jang et al. | |
| 6,664,588 | B2 | 12/2003 | Eitan | |
| 6,665,769 | B2 | 12/2003 | Cohen et al. | |
| 6,670,241 | B1 | 12/2003 | Kamal et al. | |
| 6,670,669 | B1 | 12/2003 | Kawamura | |
| 6,674,138 | B1 | 1/2004 | Halliyal et al. | |
| 6,677,805 | B2 | 1/2004 | Shor et al. | |
| 6,680,509 | B1 | 1/2004 | Wu et al. | |
| 6,686,242 | B2 | 2/2004 | Willer et al. | |
| 6,690,602 | B1 | 2/2004 | Le et al. | |
| 6,700,818 | B2 | 3/2004 | Shappir et al. | |
| 6,717,207 | B2 | 4/2004 | Kato | |
| 6,723,518 | B2 | 4/2004 | Papsidero et al. | |
| 6,731,542 | B1 | 5/2004 | Le et al. | |
| 6,738,289 | B2 | 5/2004 | Gongwer et al. | |
| 6,744,692 | B2 | 6/2004 | Shiota et al. | |
| 6,765,259 | B2 | 7/2004 | Kim | |
| 6,768,165 | B1 | 7/2004 | Eitan | |
| 6,781,876 | B2 | 8/2004 | Forbes et al. | |
| 6,788,579 | B2 | 9/2004 | Gregori et al. | |
| 6,791,396 | B2 | 9/2004 | Shor et al. | |
| 6,794,249 | B2 | 9/2004 | Palm et al. | |
| 6,794,280 | B2 | 9/2004 | Chang | |
| 6,831,872 | B2 | 12/2004 | Matsuoka | |
| 6,836,431 | B2 | 12/2004 | Chang | |
| 6,871,258 | B2 | 3/2005 | Micheloni et al. | |
| 6,885,585 | B2 | 4/2005 | Maayan et al. | |
| 6,885,590 | B1 | 4/2005 | Zheng et al. | |
| 6,912,160 | B2 | 6/2005 | Yamada | |
| 6,917,544 | B2 | 7/2005 | Maayan et al. | |

| | | | | |
|---|---|---|---|---|
| 6,928,001 | B2 | 8/2005 | Avni et al. | |
| 6,937,523 | B2 | 8/2005 | Eshel | |
| 6,967,872 | B2 | 11/2005 | Quader et al. | |
| 6,996,692 | B2 | 2/2006 | Kuono | |
| 7,079,420 | B2 | 7/2006 | Shappir et al. | |
| 7,142,024 | B2 * | 11/2006 | Youssef | 327/143 |
| 2001/0006477 | A1 | 7/2001 | Banks | |
| 2002/0004878 | A1 | 1/2002 | Norman | |
| 2002/0004921 | A1 | 1/2002 | Muranaka et al. | |
| 2002/0043994 | A1 * | 4/2002 | Bando et al. | 327/143 |
| 2002/0064911 | A1 | 5/2002 | Eitan | |
| 2002/0132436 | A1 | 9/2002 | Eliyahu et al. | |
| 2002/0140109 | A1 | 10/2002 | Keshavarzi et al. | |
| 2002/0145465 | A1 | 10/2002 | Shor et al. | |
| 2002/0191465 | A1 | 12/2002 | Maayan et al. | |
| 2002/0199065 | A1 | 12/2002 | Subramoney et al. | |
| 2003/0001213 | A1 | 1/2003 | Lai | |
| 2003/0021155 | A1 | 1/2003 | Yachareni et al. | |
| 2003/0072192 | A1 | 4/2003 | Bloom et al. | |
| 2003/0076710 | A1 | 4/2003 | Sofer et al. | |
| 2003/0117841 | A1 | 6/2003 | Yamashita | |
| 2003/0131186 | A1 | 7/2003 | Buhr | |
| 2003/0134476 | A1 | 7/2003 | Roizin et al. | |
| 2003/0142544 | A1 | 7/2003 | Maayan et al. | |
| 2003/0145176 | A1 | 7/2003 | Dvir et al. | |
| 2003/0145188 | A1 | 7/2003 | Cohen et al. | |
| 2003/0155659 | A1 | 8/2003 | Verma et al. | |
| 2003/0190786 | A1 | 10/2003 | Ramsbey et al. | |
| 2003/0197221 | A1 | 10/2003 | Shinozaki et al. | |
| 2003/0202411 | A1 | 10/2003 | Yamada | |
| 2003/0206435 | A1 | 11/2003 | Takahashi | |
| 2003/0208663 | A1 | 11/2003 | Van Buskirk et al. | |
| 2003/0209767 | A1 | 11/2003 | Takahashi et al. | |
| 2003/0214844 | A1 | 11/2003 | Iijima | |
| 2003/0218207 | A1 | 11/2003 | Hashimoto et al. | |
| 2003/0218913 | A1 | 11/2003 | Le et al. | |
| 2003/0222303 | A1 | 12/2003 | Fukuda et al. | |
| 2003/0227796 | A1 | 12/2003 | Miki et al. | |
| 2004/0012993 | A1 | 1/2004 | Kurihara | |
| 2004/0013000 | A1 | 1/2004 | Torii | |
| 2004/0014280 | A1 | 1/2004 | Willer et al. | |
| 2004/0014290 | A1 | 1/2004 | Yang et al. | |
| 2004/0021172 | A1 | 2/2004 | Zheng et al. | |
| 2004/0027858 | A1 | 2/2004 | Takahashi et al. | |
| 2004/0059883 | A1 * | 3/2004 | Oikawa et al. | 711/163 |
| 2004/0151034 | A1 | 8/2004 | Shor et al. | |
| 2004/0153621 | A1 | 8/2004 | Polansky et al. | |
| 2004/0157393 | A1 | 8/2004 | Hwang | |
| 2004/0222437 | A1 | 11/2004 | Avni et al. | |
| 2005/0117395 | A1 | 6/2005 | Maayan et al. | |
| 2005/0140405 | A1 | 6/2005 | Do et al. | |
| 2005/0232024 | A1 | 10/2005 | Atir et al. | |
| 2006/0084219 | A1 | 4/2006 | Lusky et al. | |
| 2006/0126382 | A1 | 6/2006 | Maayan et al. | |
| 2006/0126383 | A1 | 6/2006 | Shappir et al. | |

FOREIGN PATENT DOCUMENTS

| | | |
|---|---|---|
| EP | 0751560 | 6/1995 |
| EP | 0693781 | 1/1996 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10 334676 | 12/1998 |
| JP | 11-162182 | 6/1999 |
| JP | 2000075947 A * | 3/2000 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 99/31670 | 6/1999 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

Bude et al., EEPROM/Flash Sub 3.0V drain—Source Bias Hot Carrier Writing, IEDM, 1995, pp. 989-992.

Bude et al., Secondary Electron Flash—a High Performance, Low Power Flash Technology for 0.35 um and below, IEDM, 1997, 279-282.

Bude et al., Modeling Nonequilibrium Hot Carrier Device Effects, Conference of Insulator Specialists of Europe, Jun. 1997, Sweden.

Jung et al., IEEE Journal of Solid-State Circuits, Nov. 1996, 1575-1583, vol. 31, No. 11.

Campardo et al., IEEE Journal of Solid-State Circuits, Nov. 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Chan et al., A True Single-Transistor Oxide-Nitride-Oxide EEPROM Device, IEEE Electron Device Letters, Mar. 1987, vol. EDL-8, No. 3.

Eitan et al., "Hot-Electron Injection into the Oxide in n-Channel MOS Devices", IEEE Transactions on Electron Devices, vol. ED-28, No. 3, pp. 328-370, Mar. 1981.

Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.

Ma et al., A Dual-bit Split-Gate EEPROM (DSG) Cell in Contactless Array for Single-Vcc High Density Flash Memories, IEEE, 1994, 57-60.

Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.

Lee, A new approach for the floating-gate MOS nonvolatile memory, Applied Physics Letters, Oct. 1977, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Memories for Digital Applications, Dec. 1998, 2399-2421, vol. 86, No. 12, Institute of Electrical and Electronics Engineers, Inc.
Martin, Improved Circuits for the Realization of Switched-Capacitor Filters, IEEE Transactions on Circuits and Systems, Apr. 1980, 237-244, vol. CAS-27.
Tseng et al., "Thin CVD Stacked Gate Dielectric for ULSI Technology", IEEE, pp. 321-214; 1993, 13.1.1-13.1.4.
Pickar, Ion Implementation is Silicon—Physics, Processing, and Microelectronic Devices, Applied Solid State Science, 1975, 151-241, vol. 5, Academic Press.
2 Bit/Cell EEPROM Cell Using Band-To-Band Tunneling for Data Read-Out, IBM Technical Disclosure Bulletin, 1992, 136-140, vol. 35 No. 4B.
Umezawa et al., A 5-V-Only Operation 0.6-μm Flash EEPROM with Row Decoder Scheme in Triple-Well Structure, IEEE Journal of Solid-State Circuits, 1992, 1540, vol. 27.
Mitchell et al., A new self-aligned planar array cell for ultra high density EPROMS, 1987.
Esquivel et al., High Density Contactless, Self Aligned EPROM Cell Array Technology, 1986.
Johns, Martin, Analog Integrated Circuit Design, Jun. 1, 1997, Chapter 10, John Wiley and Sons Inc.
Allen et al., CMOS Analog Circuit Design, 2002, 259 pages, Oxford University Press.
Klinke et al., A very-high-slew-rate CMOS operational amplifier, IEEE Journal of Solid-State Circuits, 1989, 744-746, 24 vol.
Shor et al, paper WA2.04.01—Self regulated Four phased charge pump with boosted wells, ISCAS 2002.
Fotouhi, An efficient CMOS line driver for 1.544-Mb/s T1 and 2.048-Mb/s E1 applications, IEEE Journal of Solid-State Circuits, 2003, 226-236pages, 38vol.
P-N Junction Diode, Physics of semiconductor devices, 1981, Ch. 2, "A Wiley-Interscience Publication", John Wiley & Sons Publishers.
Chang, Non Volatile Semiconductor Memory Devices, Proceedings of the IEEE, 64 vol., No. 7, pp. 1039-1059; Jul. 1976.
Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.
4 Bits of Digital Data Fit in a Single Cell, Technology Newsletter, Electronic Design, Apr. 1, 1996.
M. Specht et al, Novel Dual Bit Tri- Gate Charge Trapping Memory Devices, IEEE Electron Device Letters, vol. 25, No. 12, Dec. 2004, pp. 810-812.
Bu, Jiankang et al., "Design Considerations in Scaled SONOS Nonvolatile Memory Devices" Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.
Adams et al., "SONOS Nonvolatile Semiconductor Memories for Space and Military Applications". Symposium, 2000. http://klabs.org/richcontent/MemoryContent/nvmt_symp/nvmts_2000/papers/adams_d.pdf.
"Philips Research—Technologies—Embedded Nonvolatile Memories" http://research.philips.com/technologies/ics/nvmemories/index.html.
"Semiconductor Memory: Non-Volatile Memory (NVM)", National University of Singapore, Department of Electrical and Computer Engineering: http://ece.nus.edu.sg/stfpage/elezhucx/myweb/NVM.pdf.
"Saifun Non-Volatile Memory Technology", 1st Edition, 2005, published and written by Salfun Semiconductors Ltd., 1110 pgs.

* cited by examiner

CIRCUIT AND METHOD FOR POWERING UP AN INTEGRATED CIRCUIT AND AN INTEGRATED CIRCUIT UTILIZING SAME

FIELD OF THE INVENTION

The present invention generally relates to the field of integrated circuits. More specifically, the present invention relates to a circuit and a method of facilitating the power-up of an integrated circuit having multiple circuit blocks and/or segments, such as analog and digital logic circuit blocks and/or segments.

BACKGROUND

Since the development and fabrication of the first integrated circuit ("IC"), also know as a "microchip," back in the early 1970, integrated circuits have become essential components in also every device, product and system produced by the human race. As the number of applications for integrated circuits has increased (ranging form computing and control systems, analog and digital signal conditioning and processing, and data storage), so has their complexity. Because of their complexity, modern day integrated circuits, such as the non-volatile memory ("NVM") integrated circuit shown in FIG. 1, may include tens of millions of transistors organized into tens or hundreds of related and interconnect circuits and/or circuit blocks.

The NVM circuit shown in FIG. 1 includes an array of NVM cells, an analog circuit block, a digital logical circuit block, and a power-up circuit block. The analog circuit block may include charge pumps and sense amplifiers needed to program/erase and read the NVM array. The digital logic circuit block may include a controller adapted, among other things, to: (1) coordinate the flow of data between an external interface and the NVM array, (2) multiplexers for accessing specific rows and columns of the NVM array, and (3) control logic to coordinate the operation and monitor various analog circuits, such as charge pumps and sense amplifiers, in the analog circuit block. Many circuits and/or circuit blocks within an IC, such as exemplified by the NVM circuit shown in FIG. 1, require different supply voltage levels to operate properly. Thus, a power-up circuit segment may monitor the supply voltage being applied to an IC and may provide an enable/reset signal to one or more of the circuits or circuit blocks when the supply voltage reaches a respective circuit's or circuit block's required voltage level. The power-up circuit may also provide an accurate reference voltage to be used by enabling circuitry associated with each of the circuits or circuit blocks.

Turning now to FIG. 2, there is shown a power-up circuit segment 200 according to the prior art. According to the exemplary prior art circuit of FIG. 2, during power-up, while VDD beings ramping upward, a power reset circuit block 210 provides an enable signal to a comparator 220 once the power reset circuit block 210 determines that VDD has reached a sufficiently high voltage level for the comparator 220 to be reliably operative. The comparator 220 may receive as an input on a first terminal some fraction of VDD, where the fraction is set by a voltage divider 240. On a second terminal, the comparator 220 may receive a reference voltage, where the reference voltage may be set according to the threshold voltage (e.g. 0.4V) of a transistor 230. According to the power-up circuit of FIG. 2, once VDD reaches some multiple (defined by the voltage divider) of the threshold voltage of transistor 230, the comparator may output a bandgap enable signal, which signal is intended to activate a bandgap reference circuit 250. The output of the bandgap reference may be used as an accurate reference voltage for determining when other circuits or circuit blocks may be enabled.

Because a bandgap circuit 250, such as the one shown in FIG. 2, requires a certain supply voltage level (e.g. 1.4 volts) to operate properly, the voltage divider 240 and the transistor 230 threshold voltage may be selected such that the comparator may enable the bandgap circuit 250 once VDD reaches that certain supply voltage level (e.g. 1.4 volts). However, due to the fact that a transistor's 230 threshold voltage may fluctuate up or down based on a number of parameters, including fabrication process deviations and operating temperature, the voltage level at which the comparator 220 may enable a bandgap reference circuit 250 may deviate by several hundred millivolt, up or down. This deviation may cause the bandgap reference operate improperly and may cause other circuits or circuit blocks to be enabled when VDD is below their respective nominal operating voltages.

There is a need in the field of IC design for a power-up circuit and method to provide a relatively accurate reference voltage and/or to facilitate circuit/circuit-block enabling signals.

SUMMARY

The present invention is a circuit and method for providing a reference voltage and/or one or more circuit/circuit-block enabling signals for an IC. According to some embodiments of the present invention, the voltage level VDD of an IC's power supply line may transition from a floating or close-to-zero voltage to an operating voltage level (e.g. 1.8 Volts) when an external power source is applied through connectors to the supply line. As the voltage level on the power supply line ramps upward towards or above a nominal operating voltage, a first threshold voltage detector circuit segment may be activated and may begin to generate a bandgap reset signal once the voltage level of the power supply reaches a first threshold voltage level. The bandgap reset signal may trigger the power-up and operation of a bandgap reference circuit segment, and according to further embodiments of the present invention, a second threshold voltage detector circuit segment, which second threshold voltage detector circuit segment may be matched with the first voltage detector circuit, may generate a voltage reset signal indicating that the bandgap reference source is powering-up.

According to some embodiments of the present invention, once the IC power supply line reaches a second threshold voltage level, the first threshold voltage detector circuit segment may disable the bandgap-reset signal. When the power supply line voltage level reaches a third threshold voltage level, which third threshold voltage level may be correlated to the output voltage level of the bandgap circuit output, the second threshold voltage detector circuit segment may either disable or otherwise modulate the voltage reset signal so as to indicate that the bandgap reference circuit is operating and providing a substantially stable reference voltage (e.g. 1.2 Volts).

The second threshold voltage level may be nearly or substantially equal to the output voltage of the bandgap reference (e.g. 1.2 Volts). According to some embodiments of the present invention, the third threshold voltage level may either be substantially equal to the second threshold voltage level or may be equal to the bandgap reference voltage output (e.g. 1.2 Volts) plus some voltage margin (e.g. 0.3 Volts).

According to further embodiments of the present invention, if the voltage level on the IC power supply line falls below the third threshold voltage level, the second threshold voltage detector circuit segment may modulate the voltage reset signal to indicate that the output of the bandgap reference circuit may be below its defined output voltage level, and the first threshold voltage detector circuit segment may again produce a bandgap reset signal.

According to some embodiments of the present invention, the voltage reset signal generated by the second voltage threshold detector circuit segment may enable the first threshold voltage detector circuit segment to generate a bandgap reset signal.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non limiting detailed description when read with the accompanied drawings in which:

Figure 1:
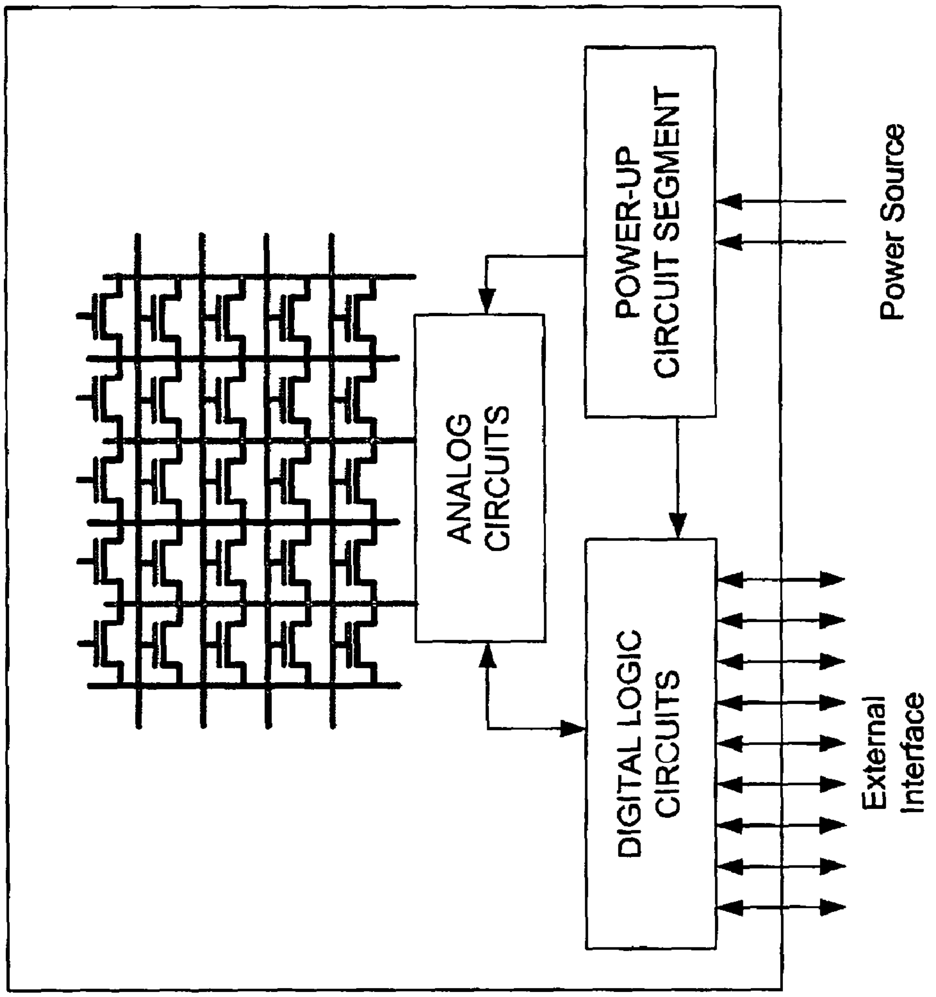
FIG. 1 shows a block diagram representing a general arrangement of circuit blocks on a non-volatile memory ("NVM") integrated circuit, including an: (1) NVM array, (2) analog circuit block, and (3) digital logic circuit block, and (4) a power-up circuit segment.
Figure 2:
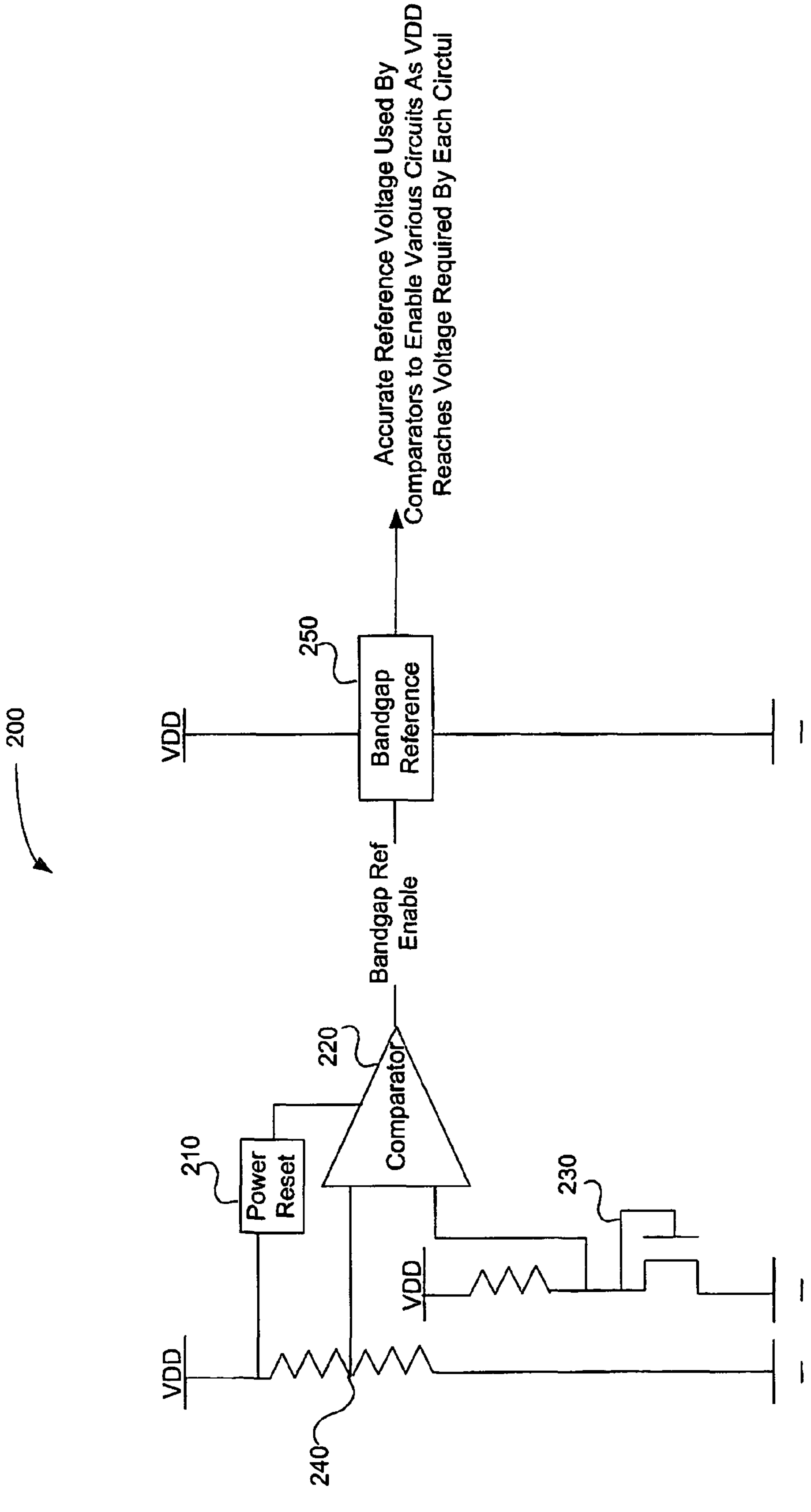
FIG. 2 shows a general circuit level diagram of an exemplary power-up circuit segment according to the prior art.

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The present invention is a circuit and method for providing a reference voltage and/or one or more circuit/circuit-block enabling signals for an IC. According to some embodiments of the present invention, the voltage level VDD of an IC's power supply line may transition from a floating or close-to-zero voltage to an operating voltage level (e.g. 1.8 Volts) when an external power source is applied through connectors to the supply line. As the voltage level on the power supply line ramps upward towards or above a nominal operating voltage, a first threshold voltage detector circuit segment may be activated and may begin to generate a bandgap reset signal once the voltage level of the power supply reaches a first threshold voltage level. The bandgap reset signal may trigger the power-up and operation of a bandgap reference circuit segment, and according to further embodiments of the present invention, a second threshold voltage detector circuit segment, which second threshold voltage detector circuit segment may be matched with the first voltage detector circuit, may generate a voltage reset signal indicating that the bandgap reference source is powering-up.

According to some embodiments of the present invention, once the IC power supply line reaches a second threshold voltage level, the first threshold voltage detector circuit segment may disable the bandgap-reset signal. When the power supply line voltage level reaches a third threshold voltage level, which third threshold voltage level may be correlated to the output voltage level of the bandgap circuit output, the second threshold voltage detector circuit segment may either disable or otherwise modulate the voltage reset signal so as to indicate that the bandgap reference circuit is operating and providing a substantially stable reference voltage (e.g. 1.2 Volts).

The second threshold voltage level may be nearly or substantially equal to the output voltage of the bandgap reference (e.g. 1.2 Volts). According to some embodiments of the present invention, the third threshold voltage level may either be substantially equal to the second threshold voltage level or may be equal to the bandgap reference voltage output (e.g. 1.2 Volts) plus some voltage margin (e.g. 0.3 Volts).

According to further embodiments of the present invention, if the voltage level on the IC power supply line falls below the third threshold voltage level, the second threshold voltage detector circuit segment may modulate the voltage reset signal to indicate that the output of the bandgap reference circuit may be below its defined output voltage level, and the first threshold voltage detector circuit segment may again produce a bandgap reset signal.

According to some embodiments of the present invention, the voltage reset signal generated by the second voltage threshold detector circuit segment may enable the first threshold voltage detector circuit segment to generate a bandgap reset signal.

Figure 3:
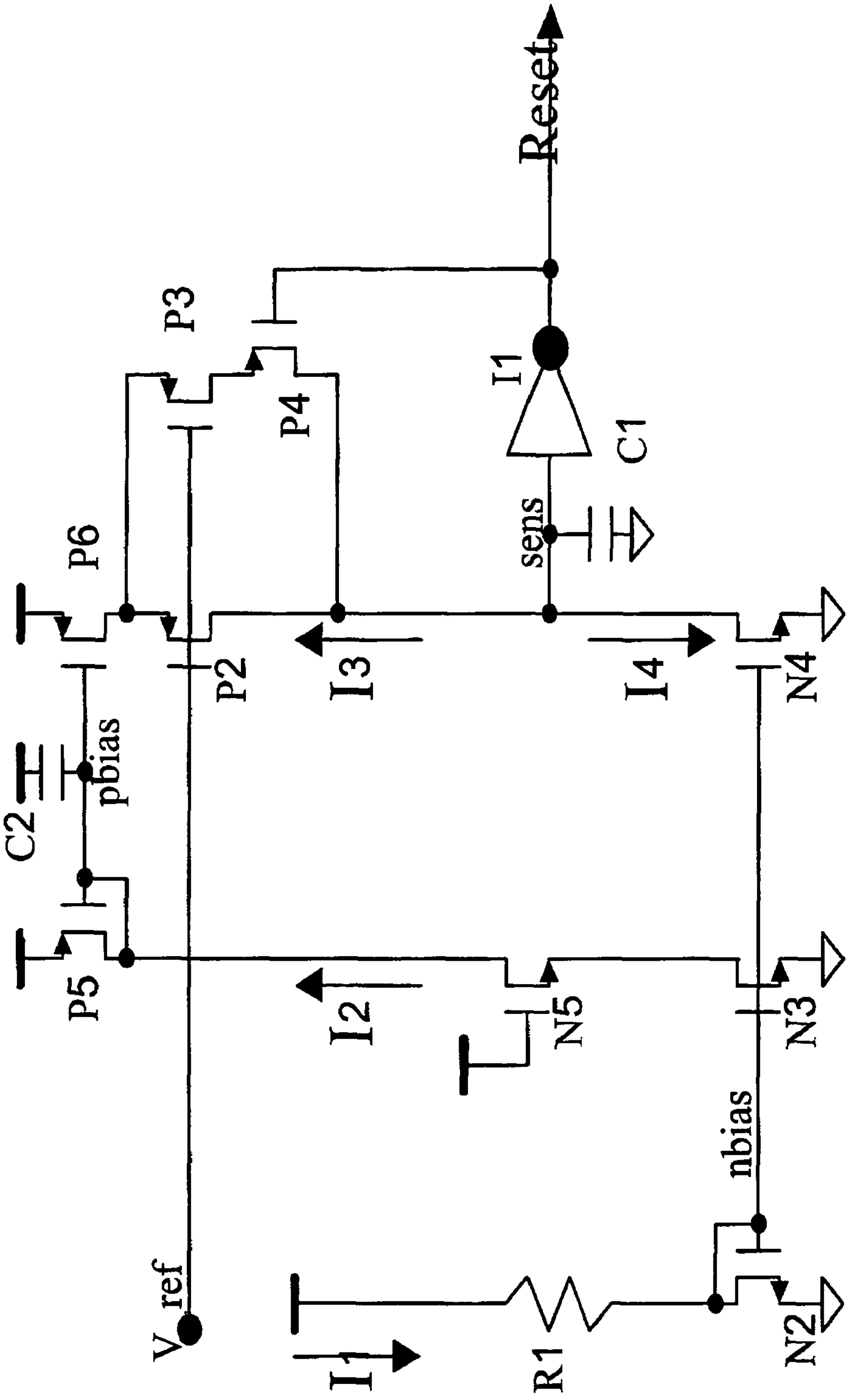
FIG. 3 shows a circuit level diagram of an exemplary voltage threshold detection circuit segment according to some embodiments of the present invention, including two sets of current mirrors in series with each other, where one branch of the current mirrors is connected to an inverter.

Turning now to FIG. 3, there is shown a circuit level diagram of an exemplary voltage threshold detection circuit segment according to some embodiments of the present invention, including three analog branched, two of which are current mirrors in series with each other, where one branch of the current mirrors is connected to an inverter. The first analog branch may be defined by elements R1 and N2; the second by elements P5, N5 and N3; and the third branch may be defined by elements P6, P2 and N4.

According to some embodiments of the present invention, transistors P5 and P6, at the top of the second and third current mirrors branches, may not be identical in size (i.e. channel width/length), but rather P6 may be designed to be larger than P5. The ratio between P5 and P6 may be for example 1.2 or any other ratio which may be determined optimal for a specific: (1) purpose, (2) set of voltages and/or (3) a specific fabrication technology.

The asymmetry between the three branches may results in each of the three branches beginning to conduct current when VDD reaches each of three different voltage levels. During operation of the circuit of FIG. 3, the first analog branch of the circuit may be the first to begin conducting, for example when VDD reaches or exceeds a minimum conducting voltage VDD_min_1, which minimum conducting voltage may be defined by the formula VDD_min_1=Vtn_lv+Vdsat (first branch, R1,N2), where, Vtn_lv is the threshold voltage of low voltage NMOS, Vtp_hv is the threshold voltage of high voltage PMOS and Vdsat is the drain-source saturation voltage. For typical parameter values such as: Vtn_lv=0.4 v, Vtp_hv=0.7 v and Vdsat=0.05 v, VDD_min_1 would equal about 0.45 v. According to some embodiments of the present invention, the minimum conducting VDD voltages levels for the second branch (VDD_min_2) and the third branch (VDD_min_3) to begin conducting may be defined by the formulas:

When V_ref=0:

$VDD\_min\_2 = Vtp\_hv + 2*Vdsat$; (second branch, P5,N5,N3)

$VDD\_min\_3 = Vtp\_P2 + Vdsat\_P6 + Vdsat\_N4$ (third branch, P6,P2,N4)

When V_ref>0:

$VDD\_min\_2 = Vtp\_hv + 2*Vdsat$; (second branch, P5,N5,N3)

$VDD\_min\_3 = V\_ref + (Vtp\_P2 + Vdsat\_P2 + Vdsat\_P6 + Vdsat\_N4)$

Thus, for the typical parameter values listed above and when V_ref is equal to 0: VDD_min_2 may equal 0.8 v, and VDD_min_3 may equal 0.8 v.

Figure 6:
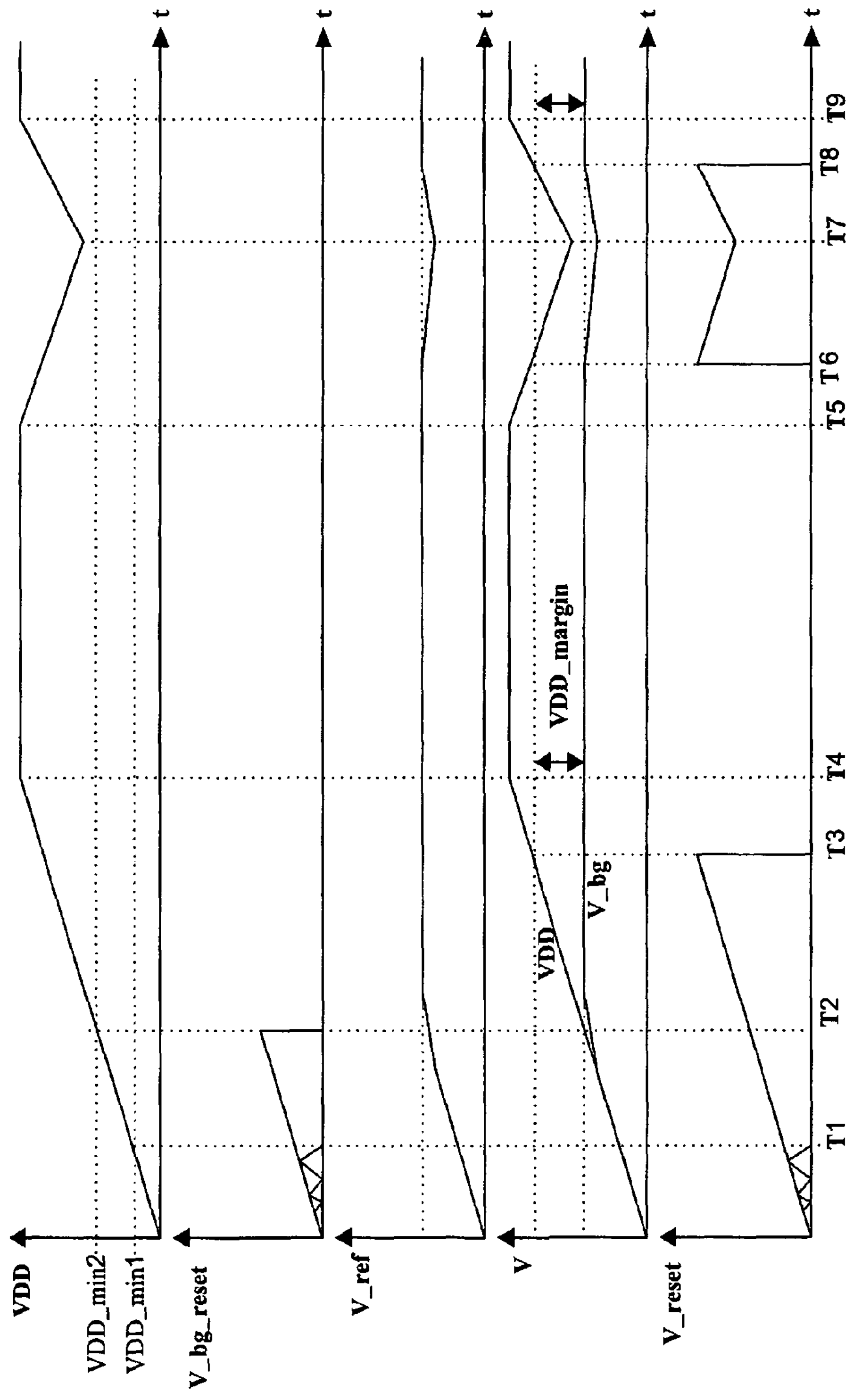
FIG. 6 shows a set of correlated voltage vs. time graphs indicating exemplary relationships between the various voltage levels at various points on a power-up circuit according to some embodiments of the present invention.

The operation of the circuit in FIG. 3, and more specifically the interrelation of the voltage level at various nodes of the circuit, may be described in view of the interrelated voltage graphs shown in FIG. 6. While VDD is in the range of 0 v<VDD<VDD_min_1 (e.g. the circuit is being powered up) currents I1, I2, I3 may be close to zero and the output voltage of the inverter (V_reset) may not be well defined. Once VDD exceeds the threshold voltage of transistor N2 (e.g. 0.4 v) (i.e. VDD=VDD_min_1@ Time=T1), current may begin to flow through N2 and this current flow may be mirrored in the second and third branches, through N3 and N4, respectively. Current flow through N4 combined with a closed P6 may cause the voltage at V_sense to be pulled close to ground, resulting in the output of the inverter whose input is connected to V_sense to generate a V_reset voltage associated with logical "1." It should be understood by one of ordinary skill in the electrical arts that the selection of which logical state (i.e. 0 or 1) output by the inverter should be correlated with which V_reset voltage level may be arbitrary. According to the example of FIG's. 3 and 6, a close to 0 voltage level may be considered a logical "0," while a close to VDD voltage level may be considered a logical "1." Thus, when V_sense is pulled close to zero, the voltage level associated with V_reset may be close to VDD.

Until VDD reaches VDD_min_2 (e.g. VDD=0.8 v@T=T2), the second branch may stay out of saturation and V_sense may continue to be pulled down to near ground by NMOS N4, and thus V_reset may remain associated with logical "1" at a voltage level close to VDD. However, once VDD reaches and/or exceeds VDD_min_2 (e.g. VDD>0.8 v@T>T2), transistors P5 may begin to conduct and current I2 in the second branch may begin flow. Since P6, which is part of a current mirror with P5, is larger than P5, when P5 starts conducting, P6 may begin to conduct at least as much current as P5, and according to some embodiments of the present invention, current may flow through P5 and P6 according to the size ration of P5:P6. Once P6 begins to conduct, V_sense may be pulled up to near VDD and the output of the inverter may change to logical "0," close to 0 volts.

Thus, according to embodiments of the present invention, when V_ref=0 v, V_reset='1' may be well defined for VDD range. VDD_min_1 (0.4 v)<VDD<VDD_min_2 (0.8 v). According to embodiments of the present invention where V_ref>0, V_reset='1' may be well defined for VDD range VDD_min_1 (0.4 v)<VDD<V_ref+(Vtp_P2+Vdsat_P2+Vdsat_P6). Thus, V_ref's voltage level may be used to adjust the VDD voltage range at which V_reset='1.'

According to some embodiments of the present invention, the voltage threshold detection circuit may include an NMOS transistor N5 that may be used for compensation of corner dependence between NMOS and PMOS transistors. Transistors P3 and P4 may be used to add hysteresys to the voltage threshold detection circuit segment.

Figure 4:
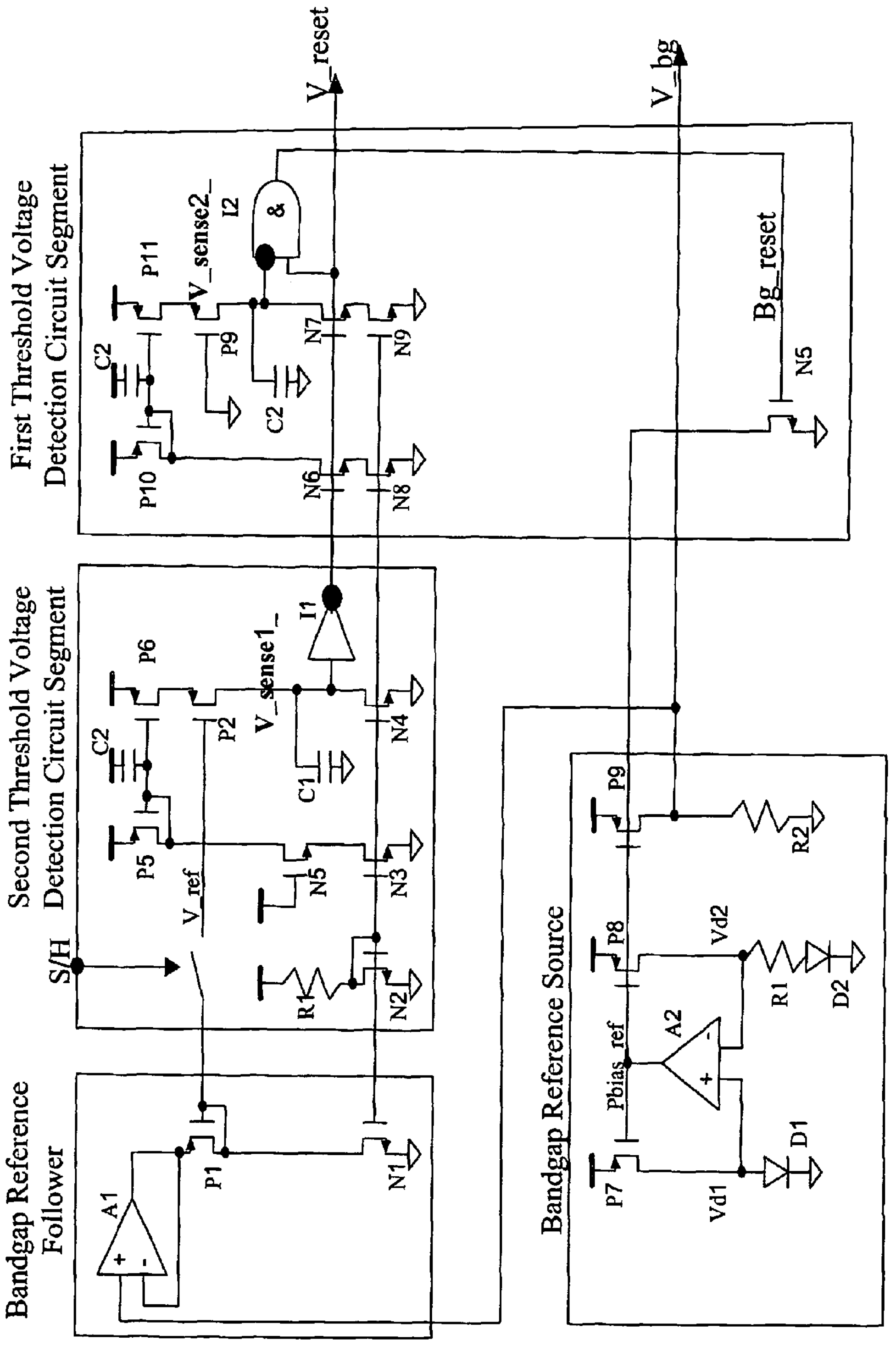
FIG. 4 shows a circuit level diagram of an exemplary voltage threshold detection and voltage reference source supply circuit according to some embodiments of the present invention, where the circuit includes two interconnected threshold voltage detection circuit segments and a bandgap reference circuit segment.
Figure 5:
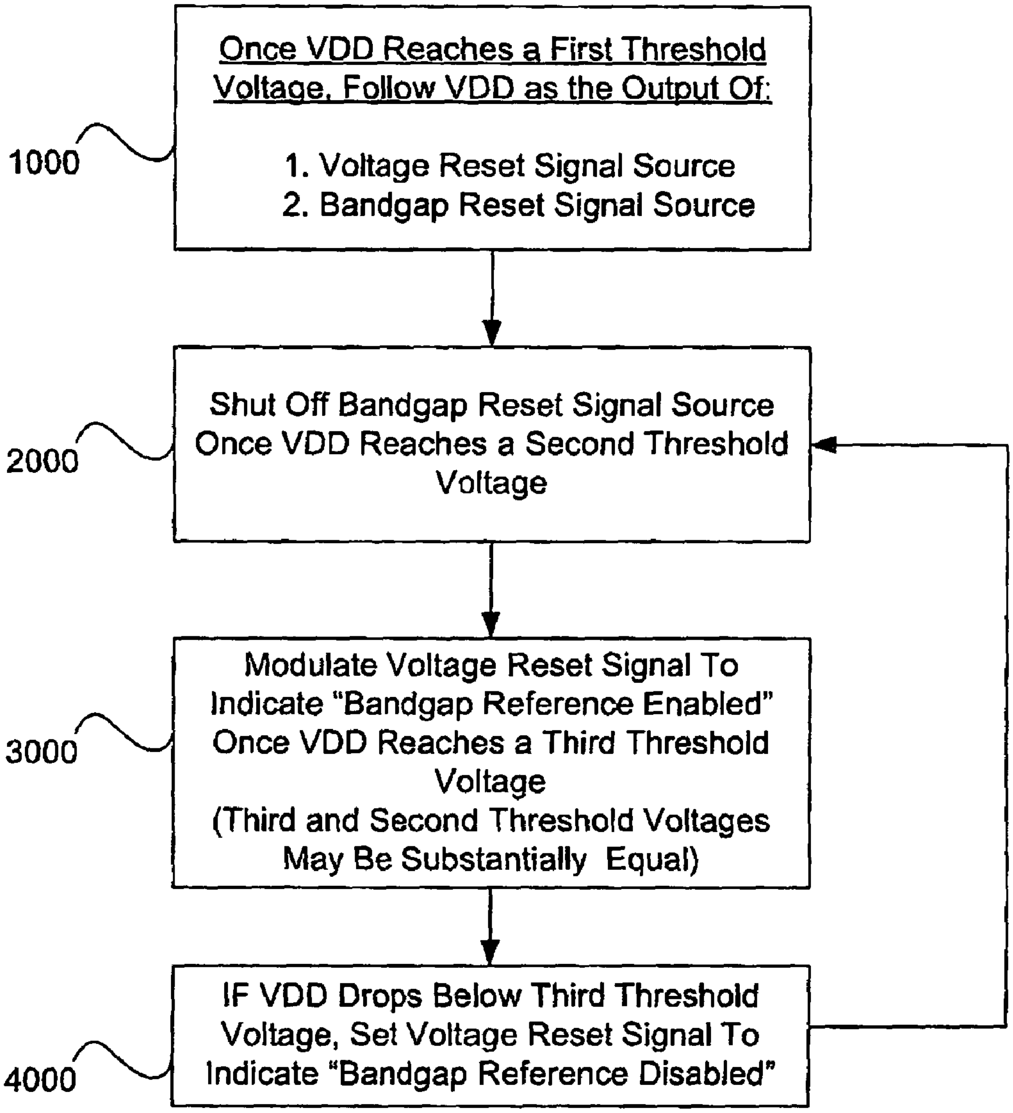
FIG. 5 shows a flow diagram including the steps of a method by which a power-up circuit according to some embodiments of the present invention may operate.

Turning now to FIG. 4, there is shown a circuit level diagram of an exemplary voltage threshold detection and voltage reference source supply circuit according to some embodiments of the present invention, where the circuit includes two interconnected threshold voltage detection circuit segments and a bandgap reference circuit segment. The exemplary voltage threshold detection and voltage reference source supply circuit may be described in view of FIG. 5, where FIG. 5 shows a flow diagram including the steps of a method by which a power-up circuit according to some embodiments of the present invention may operate, and in view of FIG. 6, which shows a set of correlated voltage vs. time graphs indicating exemplary relationships between the various voltage levels at various points on a power-up circuit according to some embodiments of the present invention.

The second voltage threshold detection circuit segment of FIG. 4 is substantially identical to the voltage threshold detection circuit segment described above in connection with FIG. 3. The first voltage threshold detection circuit segment of FIG. 4 is also substantially similar to the one describer in connection with FIG. 3, with the following exceptions. (1) it has two analog branches instead of three; (2) the gate of P9 (corresponding to P2 in FIG. 3) is grounded rather than being connected to a V_ref node, as shown in FIG. 3 (i.e. V_ref for the first threshold voltage detection circuit segment is effectively ground or 0 volts); (3) the two branches of the first voltage threshold detection circuit segment include transistors N6 and N7 whose gates are connected to each other and to the output of the inverter of the second threshold voltage detection circuit segment; and (4) instead of having an inverter, as described in connection with FIG. 3, the first threshold voltage detection circuit segment includes an "AND" logical unit, where a first of the logic unit's two inputs is connect to the output of the inverter of the second threshold detection circuit segment and the second logic unit input is inverted and connected to the V_sense2 node of the first threshold voltage detection circuit segment.

Thus, once VDD reaches a first threshold voltage (i.e. time T1 in FIG. 6), generally defined as the voltage at which the first analog branch of the second threshold voltage detection circuit segment begins to conduct, partly for the reasons stated above in connection with FIG. 3: (1) V_reset on the second threshold voltage detection circuit segment goes "high," and in-turn turns on transistors N6 and N7, and provides an enable signal to a first input of the first threshold voltage detection circuit segment's "AND" logic unit; (2) transistor N8 and N9, which are connected in a current mirroring configuration with gates connected to N2, begin to conduct and to pull node V_sense2 to ground; (3) the second input to the "AND" logic unit goes "low", (4) but since the second input of the "AND" logic unit is inverted, the output of the "AND" logic unit goes "high". The output of the "AND" logic unit going "high" may be referred to as a bandgap reset signal (FIG. 5: Step 1000). According to the exemplary embodiment shown in FIG. 4, once the output of the "AND" logic unit goes "high", the output of the "AND" logic unit may cause transistor N5 to conduct, thereby activating and/or resetting the bandgap reference source.

According to some embodiments of the present invention, V_reset signal may be used to indicate to associated circuits that a bandgap reference is being initiated, while the bandgap reference signal may be used to start initiating a bandgap reference. It should be understood by anyone of ordinary skill in the art that both the V_reset signal and the bandgap reference signal may be used to other purposes including signaling associated circuit segments to begin powering up.

The exemplary bandgap reference source shown in FIG. 4 may be referred to as a Vbe reference, and its operation may be understood using the Ebers-Moll diode equation:

Where, diode (D2)>diode (D1) (for example, D2=24×D1) and P7=P8=P9. In static state. Vd1=Vd2 is possible in two cases for diodes D1 and D2: Vd1=Vd2 when Id=0 or Id=I1

The voltage level VDD of an IC's power supply line may transition from a floating or close-to-zero voltage, when currents in diodes D1 and D2 are close to zero and floating voltage Vd1 can be equal to floating voltage Vd2. This stable state occurs in this kind of a circuit when comparator A2 raises 'pbias_ref' net in order to keep zero current in diodes D1 and D2.

Therefore, it is necessary to force down the "Pbias_ref" net until VDD voltage level rises high enough for the functionality of comparator A2.

When the 'Pbias_ref' net is forced to the ground, transistors P7 and P8 are completely opened and currents through diodes D1 and D2 may produce differential voltage for comparator (A2).

When the supply voltage reaches a second threshold voltage level (which is enough for the functionality of comparator A2), Bg_reset signal closes NMOS N5 (Unit 103) and releases voltage reference circuit (Unit 100). If VDD voltage level is still lower than the needed voltage level for the normal operation of this circuit, voltages Vd1 and Vd2 may not be equal due to low currents in diodes D1 and D2. Comparator (A2) begins to lower the "Pbiàs_ref" net in order to increase the currents in diodes D1 and D2.

Therefore, while VDD is below the required voltage level, transistors P7, P8 and P9 stay completely opened and the reference output voltage follows the VDD supplier.

When the VDD supply reaches the required voltage level, comparator A2 increases the 'Pbias_ref' net voltage in order to maintain a constant current in diodes D1 and D2 and a respectively constant output reference voltage V_bg.

It should be understood by one of ordinary skill in the art that any bandgap reference source, known today or to be devised in the future may be applicable to the present invention. The exemplary bandgap reference source shown as unit FIG. 4 may be replaced by any functionally equivalent source.

The output of the bandgap reference source may be connected to the bandgap reference follower, which bandgap reference follower may act as an output stage operating as a current buffer to mitigate current flow from the bandgap reference source. The bandgap reference follower may include an operation amplifier where one of the amplifiers inputs is the output of the bandgap reference source and the second input is direct in a direct feedback loop from the operational amplifier's output. The output of the operational amplifier may lead to ground through transistors P1 and N1, and the gate of P1 may be connected to its own drain and to the V_ref node of the second threshold voltage detection circuit segment. Because, according to the exemplary embodiment of FIG. 4, the output of the operational amplifier is connected to the V_ref node through transistor P1, which transistor P1 introduces a voltage drop, through the selection of P1, V_ref may be adjusted to be lower than the output voltage of the bandgap reference source A sample and hold circuit may sample a voltage level to be used as the applied voltage for the V_ref node in the second threshold voltage detection circuit segment.

Thus, once VDD reaches a second threshold voltage level (e.g. VDD is near or equal to the bandgap reference source output voltage), point T2 in FIG. 6, transistors P5, P6, P10 and P11 may turn on. P11 may pull up node V_sense2 to VDD, and node V_sense2 being pulled to VDD may cause the output of the "AND" logic unit in the first threshold voltage detection circuit segment to go "low", thereby shutting off the bandgap reset signal (FIG. 5: Step 2000).

Although when VDD reaches a second threshold voltage transistor P6 may conduct, while P2 is still shut off, node V_sense1 may not by pulled up to VDD. Depending upon the voltage level V_ref applied to P2, it may be required that VDD reach a third threshold voltage, a voltage level equal to the Second Threshold Voltage+Margin (See FIG. 6), before P2 begins to conduct. According to some embodiments of the present invention, the voltage level VDD should reach (FIG. 6: T=T3) before P2 may begin conducting may be defined by the above listed formulas relating to FIG. 3. According to some embodiments of the present invention, the Margin voltage may be substantially zero. According to further embodiments of the present invention, if V_ref is a non-negligible value, the Margin voltage may be several hundred millivolts and the third threshold voltage may not be substantially equal to the second threshold voltage Once VDD reaches the third threshold voltage, whether or not the third threshold voltage is substantially equal to the second threshold voltage, transistor P2 may turn on and V_sense1 may be pulled up to VDD, thereby causing the output of the inverter to go "low". The output of the inverter going low may be perceived as the shutting off or modulation of a V_reset signal according to some embodiments of the present invention (FIG. 5: Step 3000). The shutting off or modulation of the V_reset signal may indicate to associated circuits that the Bandgap reference is operational and outputting a stable reference voltage According to some embodiments of the present invention, should VDD begin to drop below the third threshold level (e.g. a voltage sufficient for the bandgap reference to operate+ Margin voltage), as shown in FIG. 6 at T+T6, the V_reset signal may modulate to indicate that the output of the bandgap reference is not totally reliable (FIG. 5: step 4000). Should the VDD drop below the second threshold voltage, the bandgap-reset signal may be activated.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of providing a reference voltage to an integrated circuit ("IC") comprising:

i generating a bandgap reset signal and a voltage reset signal once a supply voltage of the IC reaches a first threshold voltage level;

ii disabling the bandgap reset signal once the supply voltage reaches a second threshold voltage level, which second threshold voltage level is sufficient for an associated bandgap reference circuit segment to produce a substantially stable reference voltage; and iii modulating the voltage-reset signal once the supply voltage reaches a third threshold voltage so as to indicate that the bandgap reference circuit segment is operational.

2. The method according to claim 1, wherein the third threshold voltage is greater than the second threshold voltage by some voltage margin value.

3. The method according to claim 2, wherein the voltage margin value is selected such that once the supply voltage reaches the third threshold value the bandgap reference circuit segment has substantially established a steady state output.

4. The method according to claim 1, wherein the third threshold voltage is substantially equal to the second threshold voltage.

5. The method according to claim 1, wherein as part of generating a voltage reset signal an input node of a logic device is pulled to down to ground.

6. The method according to claim 5, wherein as part of modulating the voltage reset signal, the input node of the logic device is pulled up to the supply voltage level.

7. The method according to claim 1, wherein as part of generating a bandgap reset signal an input node of a logic device is pulled to down to ground.

8. The method according to claim 7, wherein as part of disabling the bandgap reset signal the input node of the logic device is pulled up to the supply voltage.

9. A circuit for providing a reference voltage to an integrated circuit ("IC") comprising:

i a first voltage threshold detection circuit segment adapted to generate a bandgap reset signal once a supply voltage of the IC reaches a first threshold voltage level and to disable the bandgap reset signal once the supply voltage reaches a second threshold voltage level, which second threshold voltage level is sufficient for an associated bandgap reference circuit segment to produce a substantially stable reference voltage, and ii a second voltage threshold detection circuit segment adapted to generate a voltage reset signal once the supply voltage of the IC reaches the first threshold voltage level and to modulate the voltage reset signal once the supply voltage reaches a third threshold voltage level so to indicate that the bandgap reference is operational.

10. The circuit according to claim 9, wherein said first voltage threshold detection circuit segment comprises two or transistor mirrors and a logic device.

11. The circuit according to claim 9, wherein said second voltage threshold detection circuit segment comprises two or transistor mirrors and a logic device.

12. The circuit according to claim 9, further comprising a bangap reference follower circuit segment.

13. The circuit according to claim 12, wherein said bandgap reference follower includes a voltage offset element adapted to introduce a voltage margin between the first and second threshold voltages.

14. An integrate circuit comprising:

i non-volatile memory circuitry;

ii a first voltage threshold detection circuit segment adapted to generate a bandgap reset signal once a supply voltage of the IC reaches a first threshold voltage level and to disable the bandgap reset signal once the supply voltage reaches a second threshold voltage level, which second threshold voltage level is sufficient for an associated bandgap reference circuit segment to produce a substantially stable reference voltage, iii a second voltage threshold detection circuit segment adapted to generate a voltage reset signal once the supply voltage of the IC reaches the first threshold voltage level and to modulate the voltage reset signal once the supply voltage reaches a third threshold voltage level so to indicate that the bandgap reference is operational; and iv wherein said non-volatile memory circuitry utilizes an output signal from the bandgap reference circuit segment.

15. The circuit according to claim 14, wherein said first voltage threshold detection circuit segment comprises two or transistor mirrors and a logic device.

16. The circuit according to claim 14, wherein said second voltage threshold detection circuit segment comprises two or transistor mirrors and a logic device.

17. The circuit according to claim 14, further comprising a bangap reference follower circuit segment.

18. The circuit according to claim 17, wherein said bandgap reference follower includes a voltage offset element adapted to introduce a voltage margin between the first and second threshold voltages.

* * * * *